(12) United States Patent
Lee et al.

(10) Patent No.: US 6,717,272 B2
(45) Date of Patent: Apr. 6, 2004

(54) REINFORCED BOND-PAD SUBSTRUCTURE AND METHOD FOR FABRICATING THE SAME

(75) Inventors: Jin-Hyuk Lee, Seoul (KR); Sa-Yoon Kang, Seould (KR); Dong-Whee Kwon, Kyungki-do (KR); Ji-Yong You, Kyungki-do (KR); Hye-Soo Shin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/376,110

(22) Filed: Feb. 26, 2003

(65) Prior Publication Data

US 2003/0178644 A1 Sep. 25, 2003

(30) Foreign Application Priority Data

Mar. 20, 2002 (KR) ........................................ 2002-15149

(51) Int. Cl.[7] .............................................. H01L 23/52
(52) U.S. Cl. ........................ 257/774; 257/775; 257/784
(58) Field of Search .................................. 257/774, 775, 257/784

(56) References Cited

U.S. PATENT DOCUMENTS 6,100,573 A * 8/2000 Lu et al. ...................... 257/508
6,444,295 B1 * 9/2002 Peng et al. ................... 428/209

* cited by examiner

Primary Examiner—David Nelms
Assistant Examiner—Tu-Tu Ho
(74) Attorney, Agent, or Firm—Marger Johnson & McCollom, P.C.

(57) ABSTRACT

A semiconductor device for reinforcing a substructure of a bond pad and a method for fabricating the same are provided. According to an embodiment, a semiconductor device for reinforcing a substructure of a bond pad comprises a semiconductor substrate and a substructure formed on the semiconductor substrate. The semiconductor device further includes an interlevel dielectric layer formed on the substructure. The interlevel dielectric layer includes a contact opening formed therein. The contact opening comprises a plurality of separate dots connected to each other. A contact plug is formed in the contact opening.

25 Claims, 6 Drawing Sheets

REINFORCED BOND-PAD SUBSTRUCTURE AND METHOD FOR FABRICATING THE SAME

This application claims priority from Korean Patent Application No. 2002-15149, filed on Mar. 20, 2002, the contents of which are incorporated herein by this reference in their entirety.

BACKGROUND OF THE INVENTION

1. Field of the Invention

The present invention relates to a semiconductor device and a method for fabricating the same and, more particularly, to a reinforced bond-pad substructure and a method for fabricating the same.

2. Description of the Related Art

As integration level of semiconductor chips increases, the size of the semiconductor chips decreases and the number of metal interconnects increases. Such an increase in the number of metal interconnects results in a decrease in the pitch between metal interconnects and also in the thickness of the metal interconnect.

Particularly, such a reduction in the thickness of a final (topmost) metal interconnect increases the defect rate of a wire bonding process in a semiconductor packaging process. Thus, in general, increasing the thickness of the final metal interconnect to form the bond pad, or reinforcing the substructure of the bond pad decreases the defect rate of the wire bonding process. (A bond pad is a portion through which the final metal interconnect is exposed for connecting integrated circuit patterns in the semiconductor chip to an external device, typically using a gold wire, solder balls, and solder bumps.)

Increasing the thickness of the final metal interconnect, however, inhibits the higher integration of the semiconductor chips. Consequently, other methods for reinforcing the underlying structure (substructure) of the bond pad, e.g., an intermetal dielectric (IMD) layer, have been introduced to reduce the defect rate of the wire bonding process.

One such method to reinforce the structure of the IMD layer includes forming a contact in the IMD layer into a line type, namely, a mesh-like, not a integral plug type, thereby improving the mechanical strength of the bond pad and increasing the reliability in the wire bonding process. In the mesh-like contact opening, the line width is formed as fine as possible while the space between line type contacts is formed as large as possible.

FIG. 1 is a cross-sectional view illustrating a substructure of a bond pad in a conventional semiconductor device and a method for fabricating the same.

Referring to FIG. 1, a conventional semiconductor device is formed of a substructure 105 including a transistor area 102 on a semiconductor substrate 100, and an insulating layer 104 on the transistor area 102. The transistor area 102 may be a transistor or bit line. A lower metal layer 106 is formed on the insulating layer 104. Then, an IMD layer 108 is deposited on the lower metal layer 106.

A reinforcing structure under a bond pad 114 is formed in the IMD layer 108. In particular, the IMD layer 108 is patterned to form a mesh-like contact opening 110 in the IMD layer 108. A conductive material is deposited on the resultant structure to fill the mesh-like contact opening 110. A planarization process such as a chemical mechanical polishing (CMP) or etchback process is then performed on the resultant structure to form the contact plug 103 that fills the mesh-like contact opening 110. A final metal interconnect 112 is deposited and patterned on the resultant structure having the contact plug 103. Then, a passivation layer 116 is deposited on the final metal interconnect 112. The passivation layer 116 is patterned to expose the bond pad 114 on which a wire bonding process is performed.

FIGS. 2 and 3 are plan views illustrating processes for forming the IMD layer 108 shown in FIG. 1. In particular, FIG. 2 is a plan view of a mask before an exposure process, and FIG. 3 is a plan view of the resulting structure including the IMD layer 108 after development and etching processes.

Referring to FIG. 2, a mask is provided to form the mesh-like contact opening 110 formed in the IMD layer 108 as shown in FIG. 1. The mask includes a mesh-like contact opening pattern 110' having a line width as small as possible while the space between each line of the mesh-like contact opening 110' is as large as possible.

The exposure process is, however, performed not only on the region of the IMD layer 108, on which the bond pad is to be formed, but also on the entire semiconductor substrate including the region underlying the bond pad to be formed. Although the line width of the mesh-like contact opening 110' is narrow to maintain the shape of the mesh-like pattern in the subsequent processes, contact holes formed in a region except for the region underlying the bond pad (a main cell region in a semiconductor memory device) are relatively large. As a result, the region on which the bond pad will be formed has the trench having line widths relatively smaller than the contact holes in the main cell region.

With reference to FIG. 3, the mesh-like contact opening 110 is formed much larger (expands) during the development and etching process than the mesh-like contact opening 110' of the mask because the trenches and contact holes having different sizes are formed in various regions, i.e., the region underlying the bond pad and the other semiconductor substrate region. Accordingly, it is impossible to attain a desired shape and dimension of the mesh-like contact opening 110 with high accuracy. In addition, even if the shape of mesh is formed as designed, a bond-pad metal layer surface can be bent, after an etchback process is performed and the bond-pad metal layer is formed.

As a result, it is difficult to form the mesh-like contact opening 110 in the IMD layer 108 located under the bond pad for practical use.

SUMMARY OF THE INVENTION

The present invention provides a semiconductor device for reinforcing a substructure of a bond pad to attain a mesh-like contact opening having a desired shape and dimension with high accuracy.

The present invention also provides a method for fabricating a semiconductor device for reinforcing a substructure of a bond pad. According to an embodiment, a semiconductor device comprises a semiconductor substrate and a substructure formed on the semiconductor substrate. The semiconductor device further includes an interlevel dielectric layer formed on the substructure. The interlevel dielectric layer includes a contact opening formed therein. The contact opening comprises a plurality of separate dots connected to each other. A contact plug is formed in the contact opening.

Accordingly, the contact opening, for example, a mesh-like contact opening, is formed in the interlevel dielectric layer located under the bond pad to increase mechanical intensity and durability of the bond pad. Therefore, the yield in the wire bonding process and reliability of the semiconductor device are significantly improved.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in various forms and should not be construed as being limited to the embodiments set forth herein. Rather, these embodiments are provided so that this disclosure will be thorough and complete, and will fully convey the concept of the invention to those skilled in the art.

A number of variations or modifications may be made within the spirit and scope of the invention. For example, the shape of a contact opening formed in an interlevel dielectric layer can be altered from a mesh shape to a rectangular ring shape. Accordingly, the embodiments of the present invention are merely illustrative and are not intended to limit the scope of the invention.

FIGS. 4 through 11 are cross-sectional views illustrating a method for fabricating a semiconductor device to reinforce a bond-pad substructure according to an embodiment of the present invention.

Figure 1:
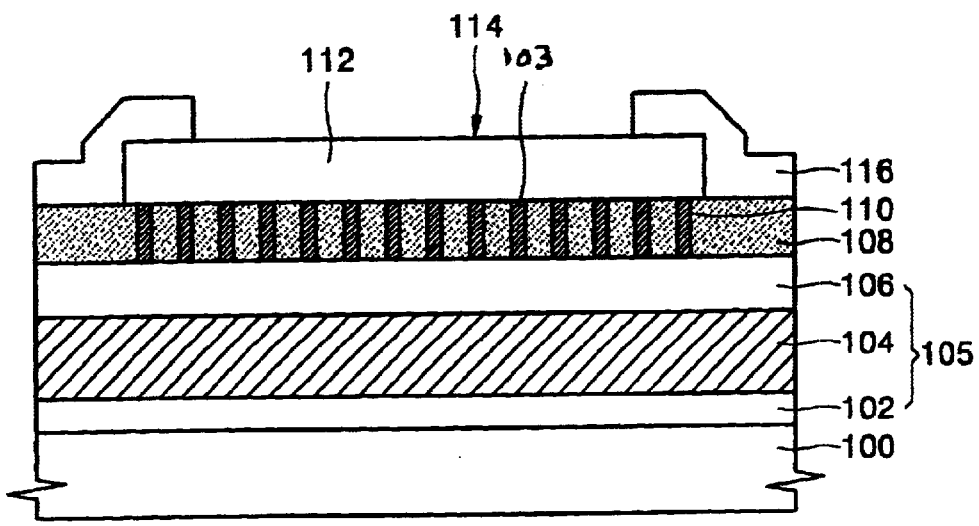
FIG. 1 is a cross-sectional view for illustrating a substructure of a bond pad in a conventional semiconductor device and a method for fabricating the same.
Figure 2:
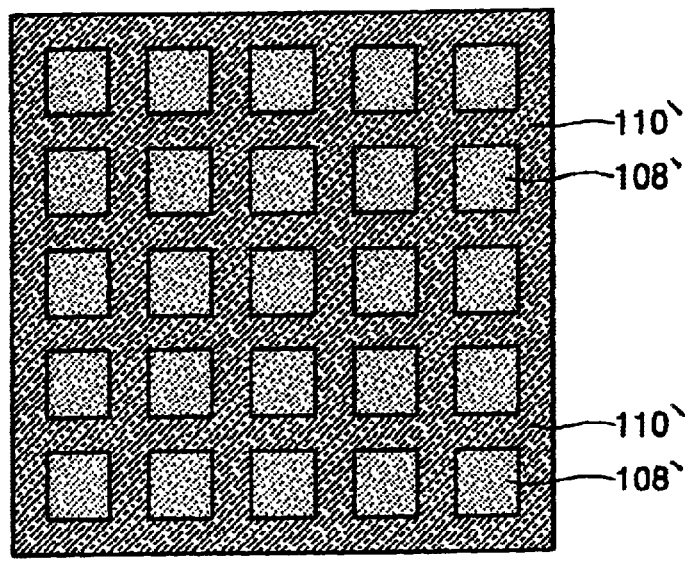
FIGS. 2 and 3 are plan views for illustrating a fabrication process of an intermetal dielectric layer (IMD) shown in FIG. 1.
Figure 3:
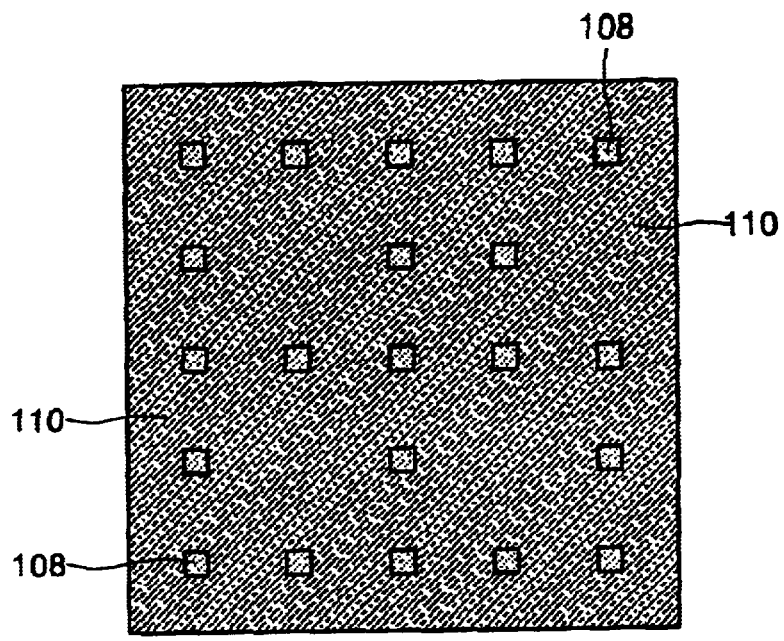
Figure 4:
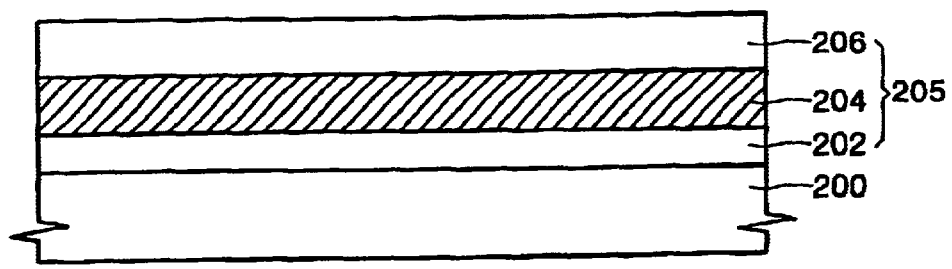
FIGS. 4 through 11 are views for illustrating the structure and fabricating method of a semiconductor device for reinforcing a substructure of a bond pad according to an embodiment of the present invention.

Referring to FIG. 4, a substructure 205 includes integrated circuit (IC) elements 202, such as transistors and bit lines, formed on a semiconductor substrate 200. The substructure 205 further includes an insulating layer 204 formed on the IC elements 202. The insulating layer 204 may be planarized using a chemical mechanical polishing (CMP) process or etchback process. The substructure 205 additionally includes a lower metal layer 206, which is formed of a material such as aluminum or polysilicon, formed on the insulating layer 204. Alternatively, the lower metal layer 206 can be replaced with other suitable conductive materials.

Figure 5:
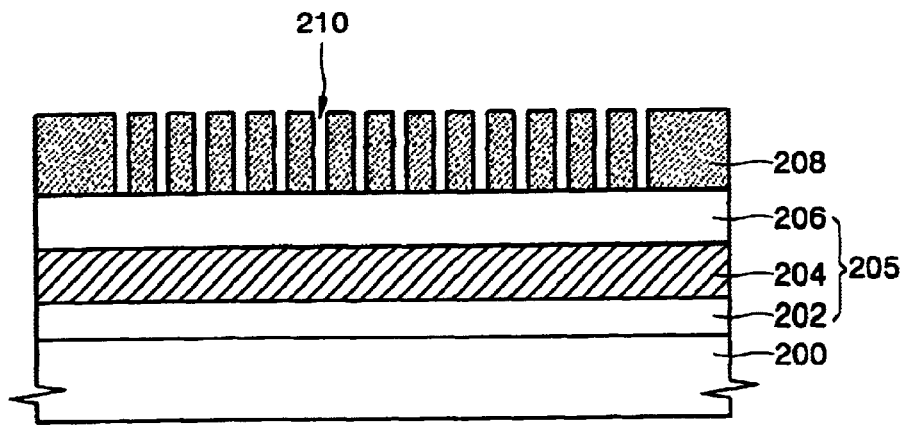

Referring to FIG. 5, an interlevel dielectric layer 208, for example, an oxide layer or a multi-layer including the oxide layer, is formed on the lower metal layer 206. Then, the interlevel dielectric layer 208 is patterned to form a mesh-like contact opening 210 according to an embodiment of the present invention.

Figure 6:
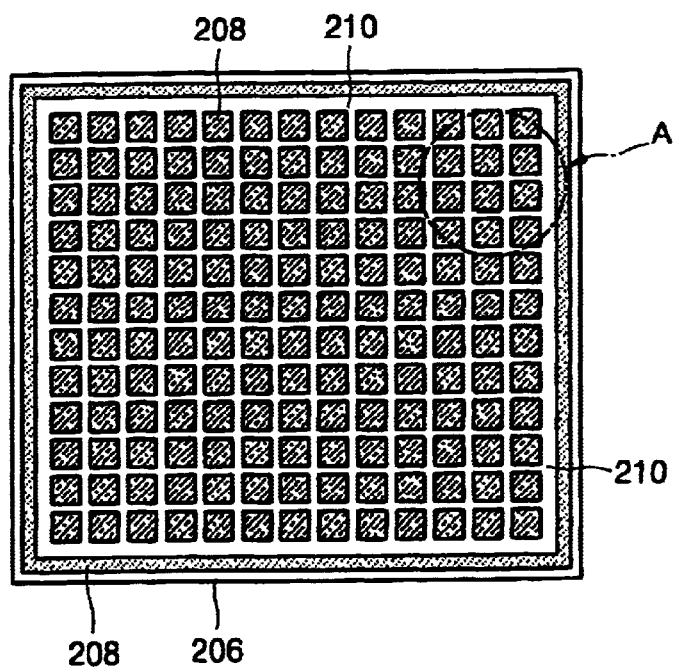

FIG. 6 illustrates the mesh-like contact opening 210 formed in the interlevel dielectric layer 208. The mesh-like contact opening 210 with a fine line width is formed in the interlevel dielectric layer 208 while having a wide interval between the lines of the mesh-like contact opening 210. The lines of the mesh-like contact opening 210 are formed of connected dots formed by an etching process using a photoresist layer 212 as shown in FIG. 7, as explained further below.

Figure 7:
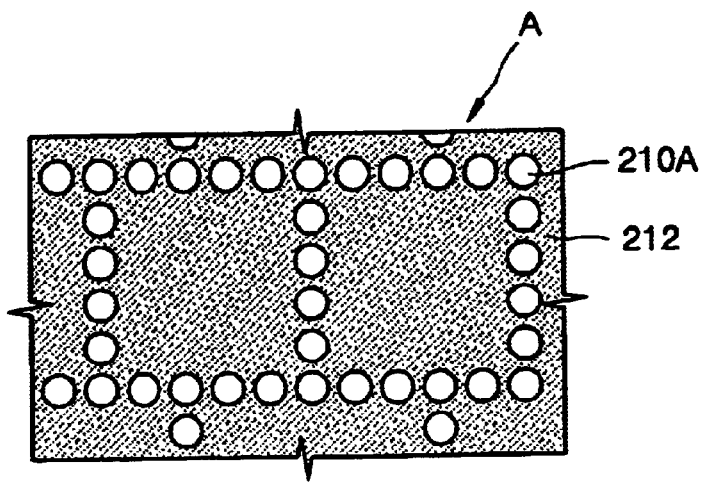

Referring to FIG. 7, to form a portion A in FIG. 6, the photoresist layer 212 is coated on the interlevel dielectric layer 208, and a transcription pattern or exposure pattern 210A is exposed onto the photoresist layer 212. The exposure pattern 210A is formed by dots in a mesh-like pattern while being separated by a predetermined interval. In other words, the exposure pattern 210A to form the mesh-like contact opening 210 is formed by arranging spaced dots in a line, not by arranging conventional straight lines. The exposure pattern 210A is designed considering the expansion thereof during the development and etching processes. The interval or spacing between the dots is about 5 to 95% of the diameter of the dots in the exposure pattern 210A, in which the interval or spacing between the dots increases as an etching margin increases. According to an aspect of the present invention, the interval or spacing between the dots is preferably about 30 to 40% of the diameter of the dots—an amount sufficient to connect the dots and to form lines in the subsequent development and etching processes.

Figure 8:
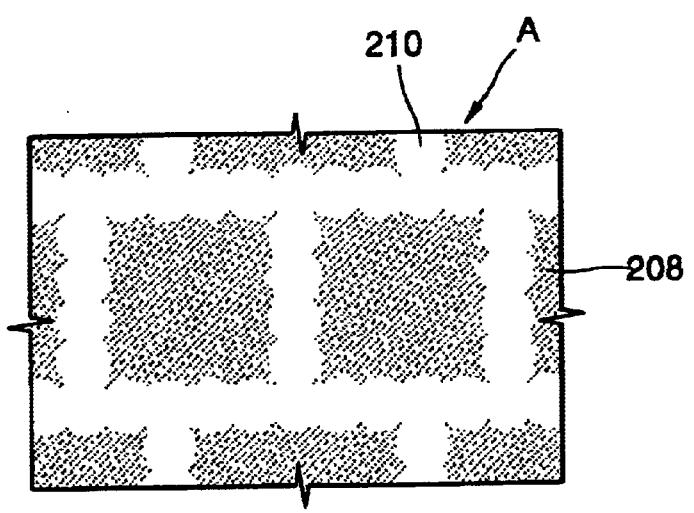

FIG. 8 is a plan view of the region A in FIG. 6 after the development and etching processes. The separate dots in the pattern 210A are transcribed in the interlevel dielectric layer 208 and, after the development and etching processes, are connected to each other to form the mesh-like contact opening 210 in the shape of lines.

As a result, the expansion of the exposure pattern 210A during the development and etching processes can be used to attain a mesh-like contact opening 210 having a desired shape and dimension with high accuracy, without the problems of the prior art discussed above. The mesh-like contact opening 210 can be made of any shape that is formed by lines, for example, a rectangular ring shape.

Figure 9:
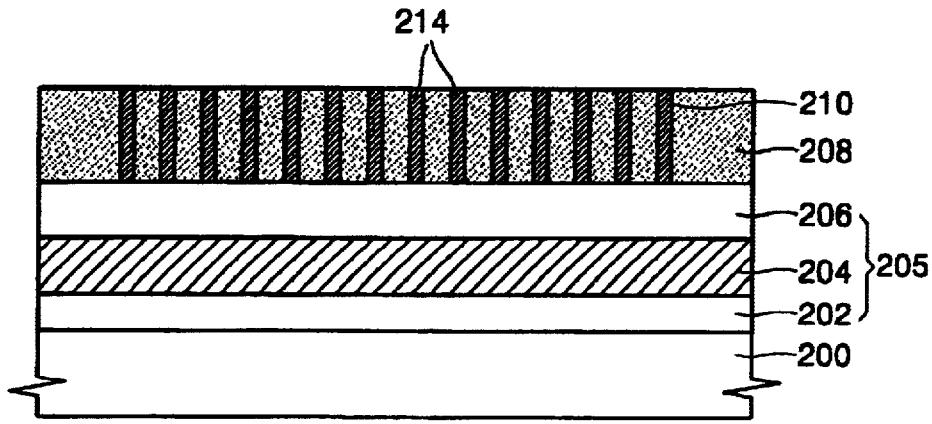

Referring to FIG. 9, a conductive material is deposited on the resultant structure having the mesh-like contact opening 210 to fill the mesh-like contact opening 210. The conductive material can be a material such as tungsten, or the same or similar material as a metal layer 216 for forming a bond pad ("a bond-pad metal layer"). The CMP or etchback process is then performed to remove the conductive material from the surface of the semiconductor substrate 200 to form a contact plug 214, which fills the mesh-like contact opening 210. However, any other suitable method can be used to fill the contact opening 210 to form the contact plug 214.

If necessary, a barrier layer or adhesion layer may be formed between the contact plug 214 and the bond-pad metal layer 206 or between the contact plug 214 and the bond-pad metal layer 216.

Figure 10:
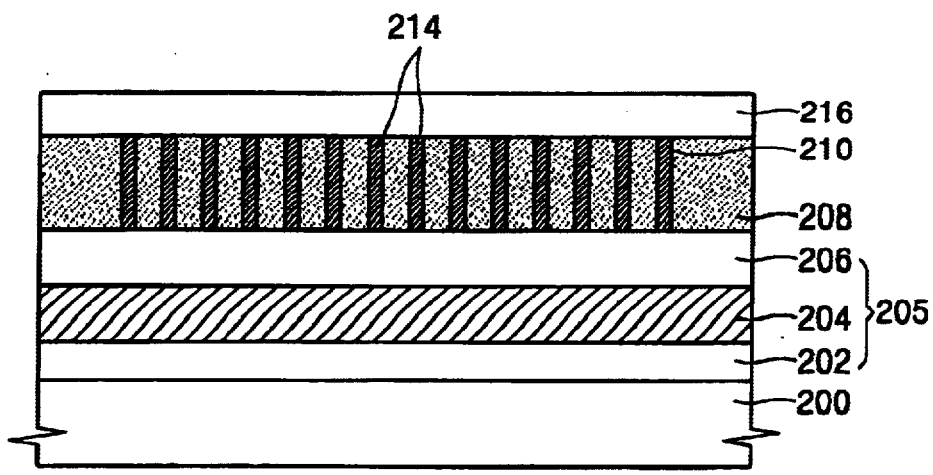

Referring to FIG. 10, the bond-pad metal layer 216 is deposited overlying the contact plug 214. The bond-pad metal layer 216 can be formed of a single layer or multi-layer structure using metal such as aluminum or copper. Depending on the types of semiconductor devices, various other conductive layer structures including the above can be used.

Accordingly, the contact plug 214, which fills the mesh-like contact opening 210 in the region of the interlevel dielectric layer 208 under the bond-pad metal layer 216, absorbs or buffers the mechanical impacts to the bond pad during the wire bonding process. Thus, the adhesion between the lower metal layer 206 and the bond-pad metal layer 216 can be significantly improved.

Consequently, the following prior art problems can be prevented: the detachment of a wire from the bond pad after the wire bonding process or leakage current generation from a broken dielectric layer located at a lower opening of the bond pad. In addition, the reliability of semiconductor devices, which can be measured by various tests such as a bond pull test (BPT), can be substantially improved.

Figure 11:
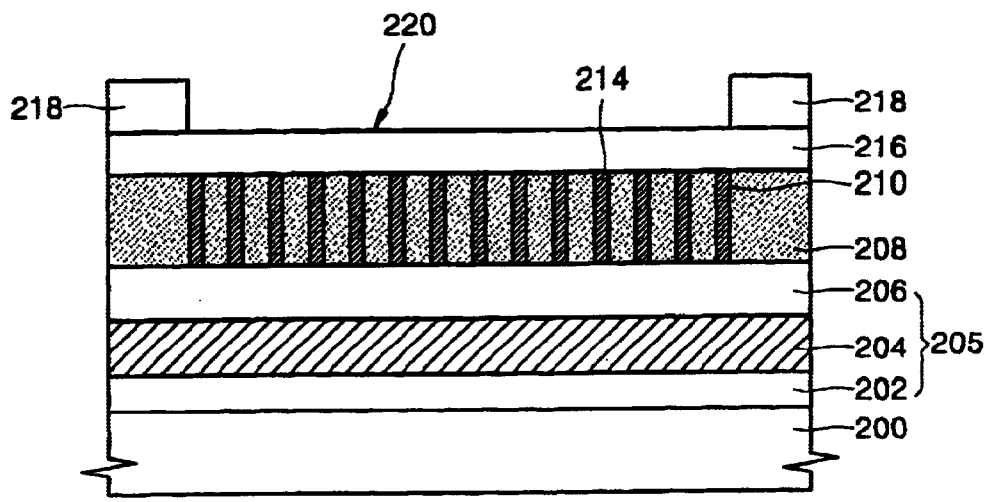

Turning to FIG. 11, a passivation layer 218 is deposited on the bond-pad metal layer 216, and the development and etching process is performed thereon to expose a region for the bond pad 220.

As a result, the semiconductor device for reinforcing the bond pad includes the substructure 205 comprising the IC elements 202, the insulating layer 204, and the lower metal layer 206, which are sequentially formed on the semiconductor substrate 200. Furthermore, the interlevel dielectric layer 208 is formed on the substructure 205 to include the mesh-like contact opening 210 (FIG. 6), in which dots are separated by a predetermined interval, for example, in a mesh-like pattern in the exposure process and connected to each other in the form of, for example, a mesh-like pattern in the development and etching process. The contact plug 214 is formed in, for example, the mesh-like contact opening formed in the interlevel dielectric layer 208, and the bond-pad metal layer 216 is formed on the interlevel dielectric layer 208. In addition, the passivation layer 218 is formed on the bond-pad metal layer 216 and is opened to expose the bond pad 220.

Figure 12:
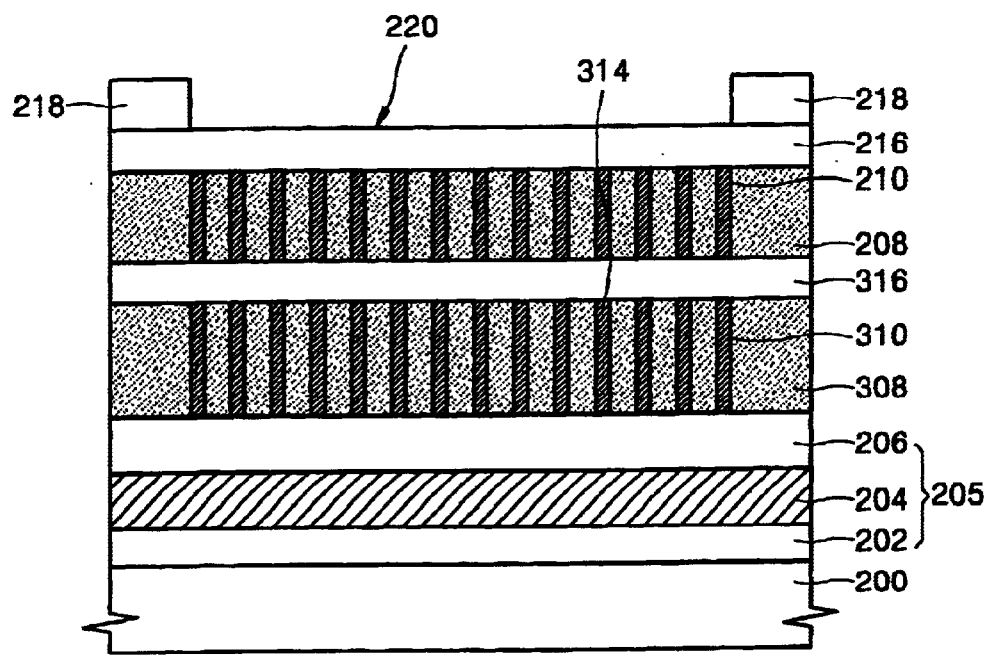
FIG. 12 is a cross-sectional view for illustrating a method for fabricating a semiconductor device for reinforcing a substructure of a bond pad according to another embodiment of the present invention.

FIG. 12 is a cross-sectional view illustrating a method for fabricating a semiconductor device for reinforcing a substructure of a bond pad according to another embodiment of the present invention. The semiconductor device according to this embodiment has an interlevel dielectric layer 208, which includes a mesh-like contact opening 210 formed, using the same or similar techniques described. However, the semiconductor device can further includes another interlevel dielectric layer 308, another contact plug 314, and another metal layer 316 between the lower metal layer 206 and the interlevel dielectric layer 208 formed, using the same or similar techniques described above.

According to the present invention, the mesh-like contact opening 210 is formed in the shapes of the lines that are formed by connecting the dots in the region of the interlevel dielectric layer 208 underlying the bond pad 220 to reinforce the mechanical strength of the bond pad 220 and improve durability, such as adhesion and buffering capacity, of the bond pad 220. Therefore, the yield in the wire bonding process and the semiconductor device reliability can be significantly improved.

It is noted that the present invention is not limited to the preferred embodiments described above, and it is apparent that variations and modifications by those skilled in the art can be effected within the spirit and scope of the present invention defined in the appended claims.

What is claimed is:

1. A semiconductor device for reinforcing a substructure of a bond pad, the device comprising:
   a semiconductor substrate;
   a substructure formed on the semiconductor substrate;
   an interlevel dielectric layer formed on the substructure, the interlevel dielectric layer including a contact opening formed therein, the contact opening comprising a plurality of separate dots connected to each other; and
   a contact plug formed in the contact opening.

2. The semiconductor device of claim 1, wherein the contact opening comprises a rectangular-ring-shape or mesh-like contact opening.

3. The semiconductor device of claim 1, wherein the substructure comprises:
   an IC element;
   an insulating layer formed on the IC element; and
   a lower metal layer formed on the insulating layer.

4. The semiconductor device of claim 3, wherein the insulating layer is planarized.

5. The semiconductor device of claim 1, further comprising:
   a bond-pad metal layer formed on the interlevel dielectric layer to form a bond pad.

6. The semiconductor device of claim 5, further comprising a passivation layer formed on the bond-pad metal layer, the passivation layer having an opening therein to expose the bond pad.

7. The semiconductor device of claim 5, wherein the contact plug is formed of the same material as the bond-pad metal layer.

8. The semiconductor device of claim 5, wherein the bond-pad metal layer is formed of a single layer or multi-layer structure.

9. The semiconductor device of claim 1, wherein the contact plug is formed of tungsten.

10. The semiconductor device of claim 1, further comprising another interlevel dielectric layer, another contact plug, and another bond-pad metal layer.

11. A method for fabricating a semiconductor device for reinforcing a substructure of a bond pad, the method comprising:
   forming a substructure on a semiconductor substrate;
   forming an interlevel dielectric layer on the substructure;
   coating and exposing a photoresist layer on the interlevel dielectric layer to transcribe a mesh-like pattern onto the photoresist layer, the mesh-like pattern comprising dots separated by a predetermined interval;
   developing and etching the exposed interlevel dielectric layer, thereby forming a contact opening by connecting the dots through the expansion thereof; and
   filling the contact opening in the interlevel dielectric layer with a conductive material to form a contact plug.

12. The semiconductor device of claim 11, wherein the contact opening comprises a rectangular-ring-shape or mesh-like contact opening.

13. The method of claim 11, wherein the forming a substructure comprises:
   forming IC elements on the semiconductor substrate;
   forming a planarized insulating layer on the IC elements; and
   forming a lower metal layer on the insulating layer.

14. The method of claim 11, further comprising:
   forming a bond-pad metal layer on the interlevel dielectric layer in which the contact plug is filled.

15. The method of claim 14, further comprising:
   depositing a passivation layer on the bond-pad metal layer; and
   patterning the passivation layer to expose the bond pad.

16. The method of claim 14, wherein the conductive material for the contact plug is formed of the same material as the bond-pad metal layer.

17. The method of claim 15, wherein the bond-pad metal layer is formed of a single layer or multi-layer structure.

18. The method of claim 11, further including planarizing the resulting structure after filling the contact opening in the interlevel dielectric layer with a conductive material.

19. The method of claim 11, further comprising forming another interlevel dielectric layer, another contact plug, and another bond-pad metal layer.

20. The method of claim 11, wherein the interval between the dots ranges from about 5 to 95% of the diameter of the dots in the mesh-like pattern.

21. The method of claim 20, wherein the interval between the dots ranges from about 30 to 40% of the diameter of the dots in the mesh-like pattern.

22. The method of claim 11, wherein the conductive material for the contact plug is formed of tungsten.

23. A semiconductor device formed by a process comprising:

forming a substructure on a semiconductor substrate;

forming an interlevel dielectric layer on the substructure;

coating and exposing a photoresist layer on the interlevel dielectric layer to transcribe a mesh-like pattern onto the photoresist layer, the mesh-like pattern comprising dots separated by a predetermined interval;

developing and etching the exposed interlevel dielectric layer, thereby forming a mesh-like contact opening by connecting the dots through the expansion thereof; and filling the mesh-like contact opening in the interlevel dielectric layer with a conductive material to form a contact plug.

24. The semiconductor device of claim 23, wherein the interval between the dots ranges from about 5% to 95% of the diameter of the dots in the mesh-like pattern.

25. The semiconductor device of claim 24, wherein the interval between the dots ranges from about 30% to 40% of the diameter of the dots in the mesh-like pattern.

* * * * *